United States Patent [19]

Wu et al.

[11] Patent Number: 5,194,824
[45] Date of Patent: Mar. 16, 1993

[54] 5V RAIL-RAIL UNITY GAIN AMPLIFIER DRIVING HIGH CAPACITIVE LOAD

[75] Inventors: Jack C. H. Wu, Tempe; David G. England, Phoenix, both of Ariz.

[73] Assignee: Intel Corporation, Santa Clara, Calif.

[21] Appl. No.: 824,338

[22] Filed: Jan. 23, 1992

[51] Int. Cl.$^5$ ............................ H03F 3/45; H03F 3/68
[52] U.S. Cl. ...................................... 330/255; 330/295
[58] Field of Search ................. 330/146, 255, 295, 253

[56] References Cited

FOREIGN PATENT DOCUMENTS 2036493 6/1980 United Kingdom ................. 330/255

Primary Examiner—James B. Mullins
Attorney, Agent, or Firm—Blakely, Sokoloff, Taylor & Zafman

[57] ABSTRACT

A unity gain amplifier based on CMOS technology designed to drive a large capacitive load such as a piezoelectric speaker with a 5V power supply. The invention utilizes a rail-to-rail voltage range (i.e., ground to power supply voltage) at its input as well as at its output and is capable of entering into a power down mode, In this manner, it is possible to produce as a single application specific integrated circuit (ASIC), a circuit for converting a digital signal to an analog signal and amplifying the analog signal so as to be capable of driving a large capacitive load with a rail-to-rail dynamic range and which operates at low noise.

3 Claims, 5 Drawing Sheets

5V RAIL-RAIL UNITY GAIN AMPLIFIER DRIVING HIGH CAPACITIVE LOAD

SUMMARY OF THE INVENTION

The present invention is a unity gain amplifier based on CMOS technology designed to drive a large capacitive load such as a piezoelectric speaker with a 5V power supply. The invention utilizes a rail-to-rail voltage range (i.e., ground to power supply voltage) at its input as well as at its output and is capable of entering into a power down mode. In this manner, it is possible to produce as a single application specific integrated circuit (ASIC), a circuit for converting a digital signal to an analog signal and amplifying the analog signal so as to be capable of driving a large capacitive load. A power down circuit is employed in order to reduce power consumption by allowing a user to input a signal which turns the amplifier off.

In the prior art, external discrete bipolar Operational Amplifiers (OpAmps) are used to perform the same function. However, OpAmps require a higher device count resulting in a higher cost and increased board space as compared to the present invention. The invention reduces manufacturing costs so that the discrete OpAmps can be replaced with this design. Furthermore, this invention provides a rail-to-rail dynamic range and operates at low noise.

DETAILED DESCRIPTION OF THE INVENTION

Figure 1:
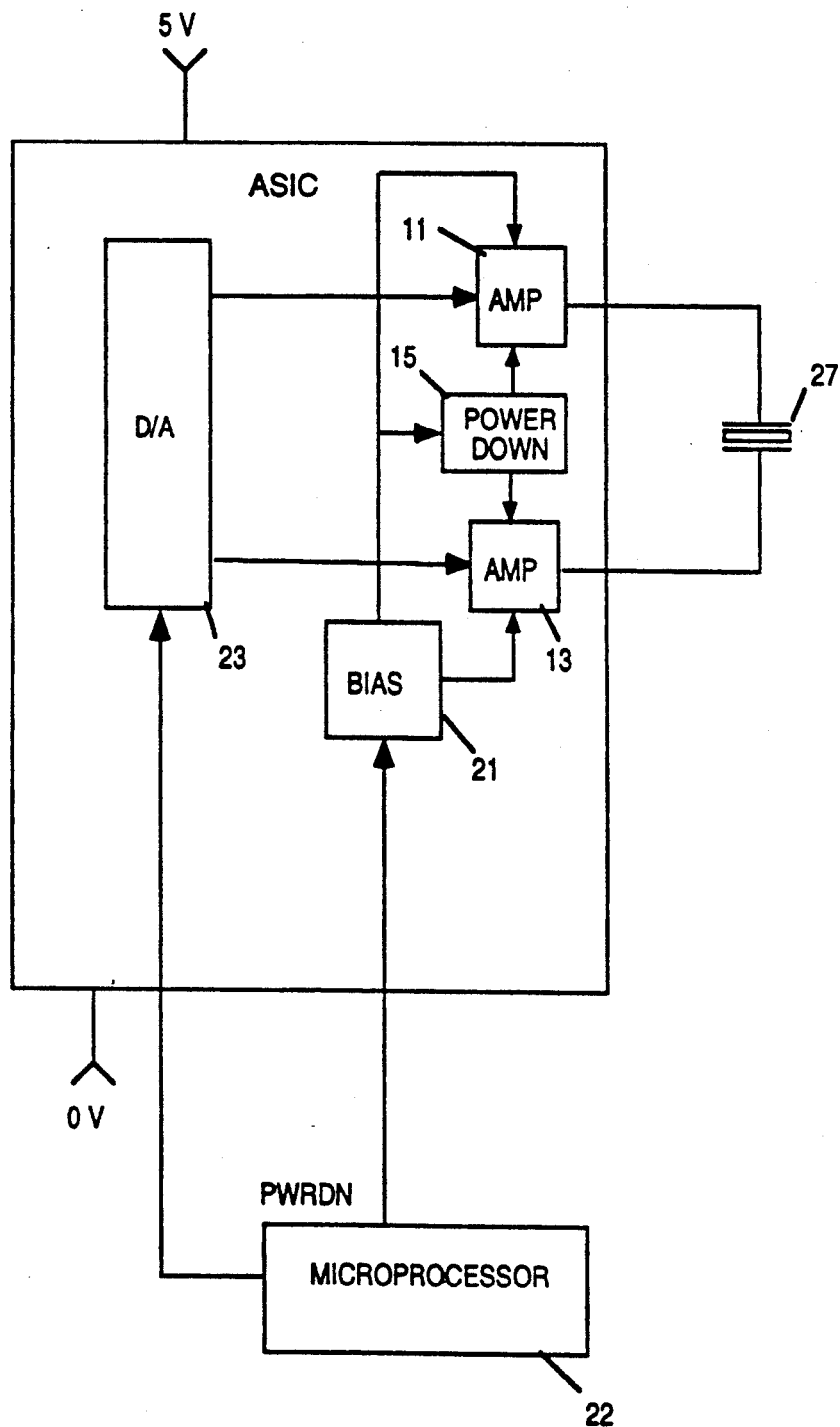
FIG. 1 is a block overview diagram of an ASIC implementing the invention coupled to a microprocessor and speaker.

Referring to FIG. 1, the invention utilizes two unity-gain, rail-to-rail, input/output amplifiers 11 and 13 forming a fully differential amplifier, also known as a bridge amplifier. In this manner, the dynamic range obtained is twice that of a single OpAmp because both positive and negative input voltages are utilized. The invented design provides additional advantages such as good rejection of common-mode signals, the elimination of system clock feedthrough noise from a digital environment and reduction of offset voltage (i.e., differences between input voltage and output voltage). Microprocessor 22 produces digital data which is input to digital to analog converter 23 which produces a differential analog signal input to amplifiers 11 and 13. Amplifiers 11 and 13 amplify the differential analog signal to drive piezoelectric speaker 27 or other device with a high capacitive load. Microprocessor 22 also generates a power down signal PWRDN which is input to bias circuit 21 which operates to disable amplifiers 11 and 13 and disable power down bias circuit 15. Bias circuit 15 outputs signals to bias NMOS and PMOS transistors used by amplifiers 11 and 13.

Figure 2:
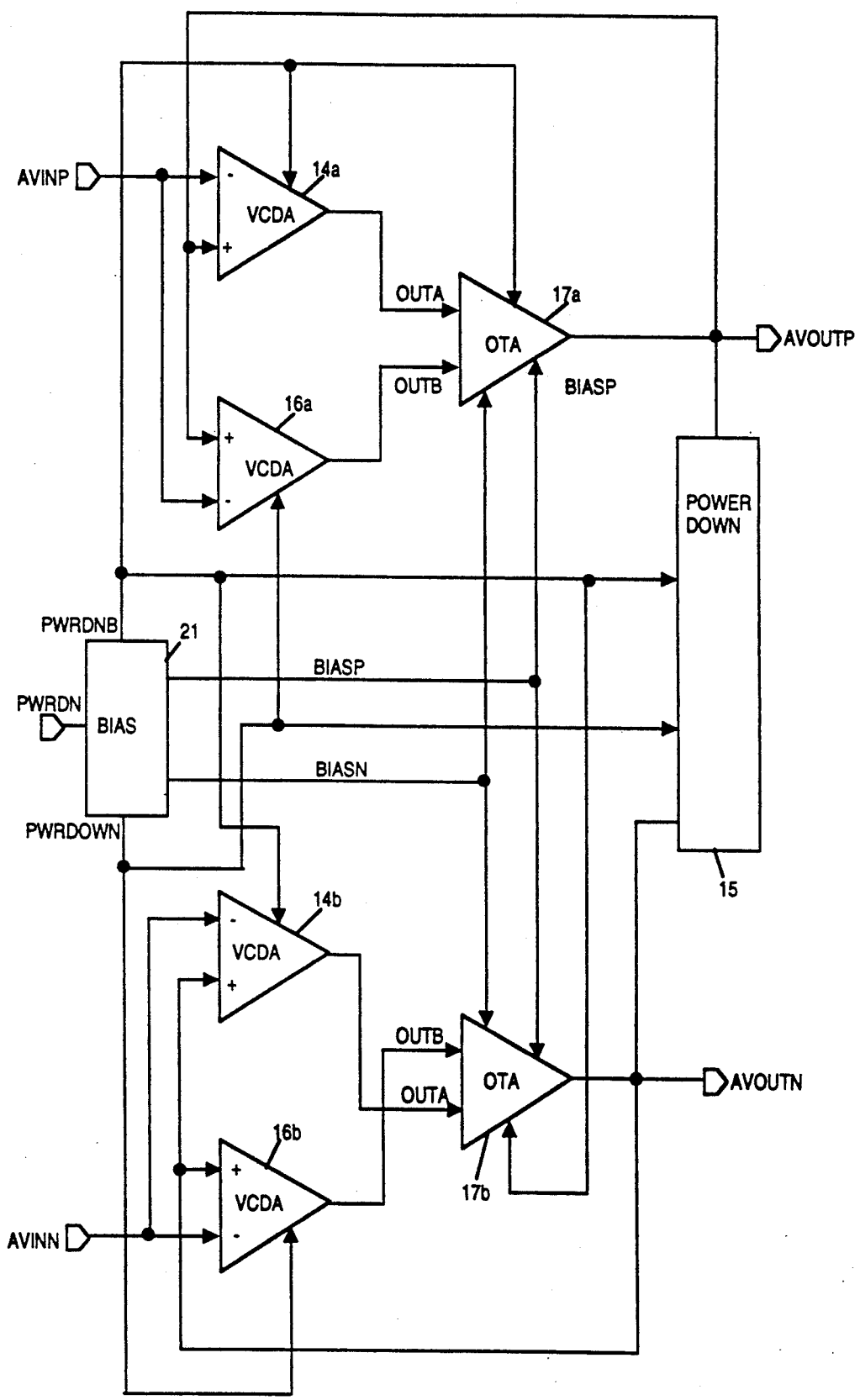
FIG. 2 is a block diagram of unity gain amplifiers 11 and 13.

In order to achieve a rail-to-rail dynamic range output, as shown in FIG. 2, each single unity-gain amplifier 11 and 13 is configured as two very-wide-common-mode-range differential amplifiers (VCDA) 14a/14b and 16a/16b driving a corresponding operational transconductance amplifier (OTA) 17a/17b and biased by a compensated, current mirror voltage divider 21. The amplifier formed by unity gain amplifiers 11 and 13 is capable of driving a large capacitive load up to 200 nanofarads with a 5 volt power supply.

The signals shown in FIG. 2 have the following descriptions:

| Signal | Type | Description |
| --- | --- | --- |
| AVINP | Input | Internal analog voltage input (Positive) from digital to analog converter 23 |
| AVINN | Input | Internal analog voltage input (Negative) from digital to analog converter 23 |
| PWRDN | Input | Internal power down control signal from microcomputer 22 |
| AVOUTP | Output | External analog voltage output (Positive) to speaker 27 |
| AVOUTN | Output | External analog voltage output (Negative) to speaker 27 |

Figure 3:
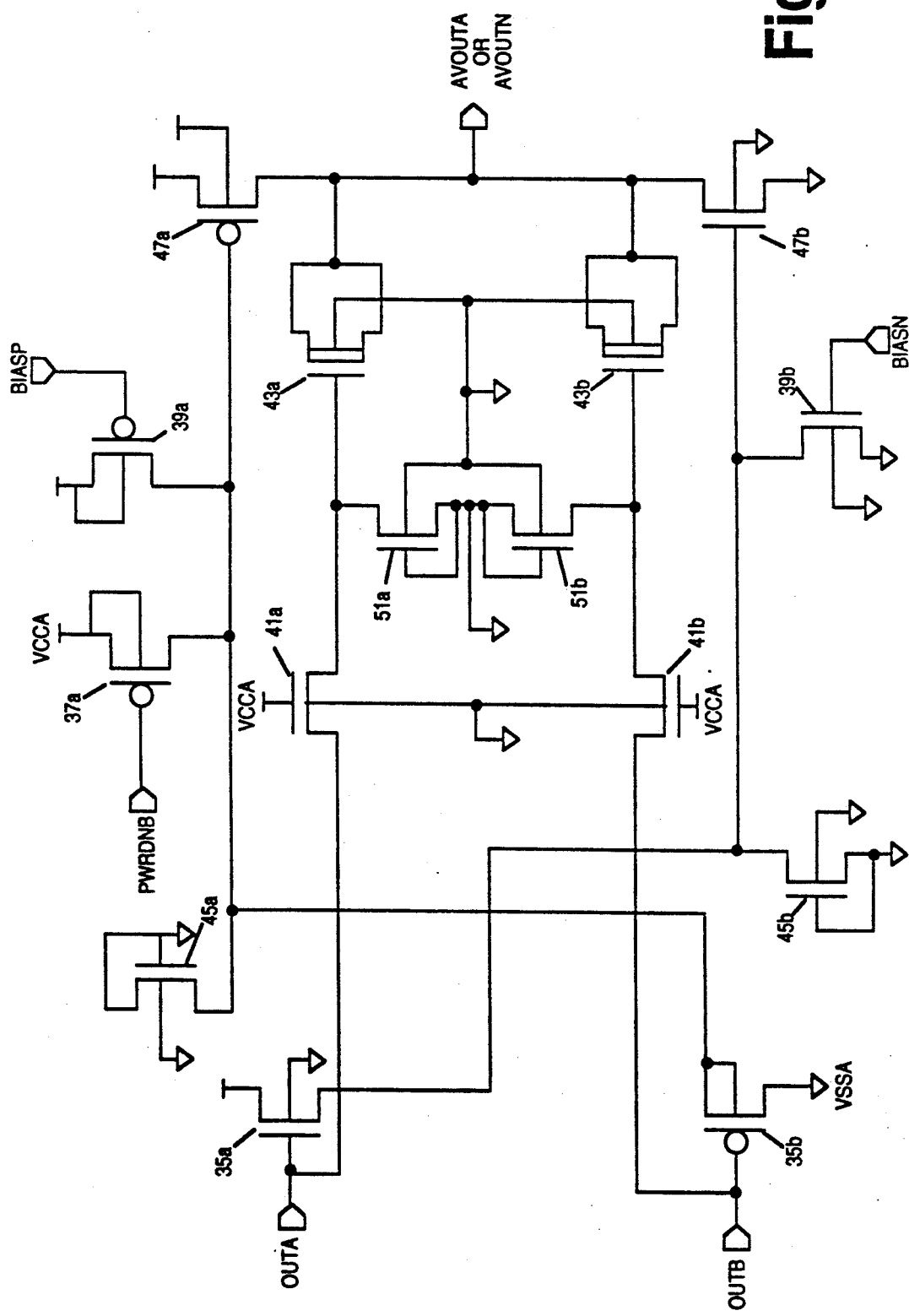
FIG. 3 is a circuit diagram of transconductance amplifiers 17a and 17b.

OTAs 17a and 17b are push-pull class AB operational transconductance amplifiers, each of which provides a large output current for quick slewing and an adequate phase margin for good stability while driving a large capacitive load. OTAs 17a and 17b utilize the VCDA outputs OUTA and OUTB to provide additional gain. The input PWRDNB to OTA 17a and OTA 17b disables P transistor 37a as shown in FIG. 3. The input PWRDOWN to VCDAs 16a and 16b disables appropriate N transistors of the VCDAs. The bias signals BIASP and BIASN input to OTAs 17a and 17b from bias circuit 21 bias transistors 39a and 39b (see FIG. 3). Power down circuit 15 inputs the signals PWRDNB and PWRDOWN to enable transistors 81 and 87 (see FIG. 5).

FIG. 3 illustrates circuit details for OTA 17a and 17b. Also, each amplifier is compensated using two Miller capacitors 43a and 43b along with their corresponding zero nulling MOS resistors 41a and 41b. This compensation guarantees enough gain margin for wide range capacitive loads up to 200nF.

FIG. 3 is a circuit diagram of OTAs 17a or 17b, both components being identical, and having the signals OUTA, OUTB, PWRDNB, BIASP and BIASN as inputs and the signal AVOUTP (for OTA 17a) or AVOUTN (for OTA 17b) as outputs. The signal OUTA is input to N channel enhancement mode transistor 35a. The signal PWRDNB is input to P channel enhancement mode transistor 37a. The signal BIASP is input to transistor 39a and the signal BIASN is input to Transistor 39b. The drain of transistor 45a protects transistor 47a so that ESD (Electro-Static Discharge) does not punch through its input gate. The output signal AVOUTP/AVOUTN is fed-back from a depletion MOS capacitor 43a cascading with a MOS null resistor 41a to stabilize the entire amplifier system. Again, the drain of transistor 51a is to protect the MOS depletion capacitor 43a from ESD punch through. The network of transistors 35a, 37a, 39a, 41a, 43a and 45a provides sufficient gain to drive the output P transistor 47a for charging up a very large capacitor, e.g., greater than 0.4 $\mu F$.

In a similar manner, the signal OUTB is coupled to the P channel enhancement mode transistor 35b with transistors 39b, 41b, 43b, 45b and 47b operating in a corresponding manner as transistors 35a, 39a, 41a, 43a, 45a and 47a excepting that the network of transistors operating on the signal OUTB is for, driving the output N MOS transistor 47b with a sufficient discharging current.

The device sizes of the transistors in the circuit of FIG. 3 are important and are determined by the load. For example, for a load having an impedance of 300 nanofarads at 8KHz, the devices have values shown in Table I.

TABLE I

| Transistor | Transistor Width | Transistor Length |
|---|---|---|
| 35a | 50 | 8 |
| 37a | 8 | 8 |
| 39a | 200 | 15 |
| 41a | 10 | 90 |
| 43a | 200 | 200 |
| 47a | 4500 | 5.5 |
| 35b | 500 | 8 |
| 39b | 200 | 15 |
| 41b | 10 | 90 |
| 43b | 200 | 200 |
| 45b | 24 | 5 |
| 47b | 1800 | 5.5 |
| 51a | 24 | 5 |
| 51b | 24 | 5 |

There are two different VCDAs 14a/14b and 16a/16b for each OTA providing voltage shifting for driving the OTAs so that low power supply voltage and process variations will not affect the proper operation of the output stage. Each VCDA utilizes self-biasing to extend the dynamic input range thus achieving a rail-to-rail input capability. This self-biasing created by a negative feedback loop greatly reduces the sensitivity of bias voltage to variations in processing and supply voltage. Therefore, the input stage designed with two VCDAs can tolerate a 3.3 volt minimum, which of course is a basic requirement in digital and analog mixed-mode design. Details for suitable VCDAs 15a/15b and 16a/16b may be found in U.S. Pat. No. 4,958,133 issued Sep. 18, 1990.

Figure 4:
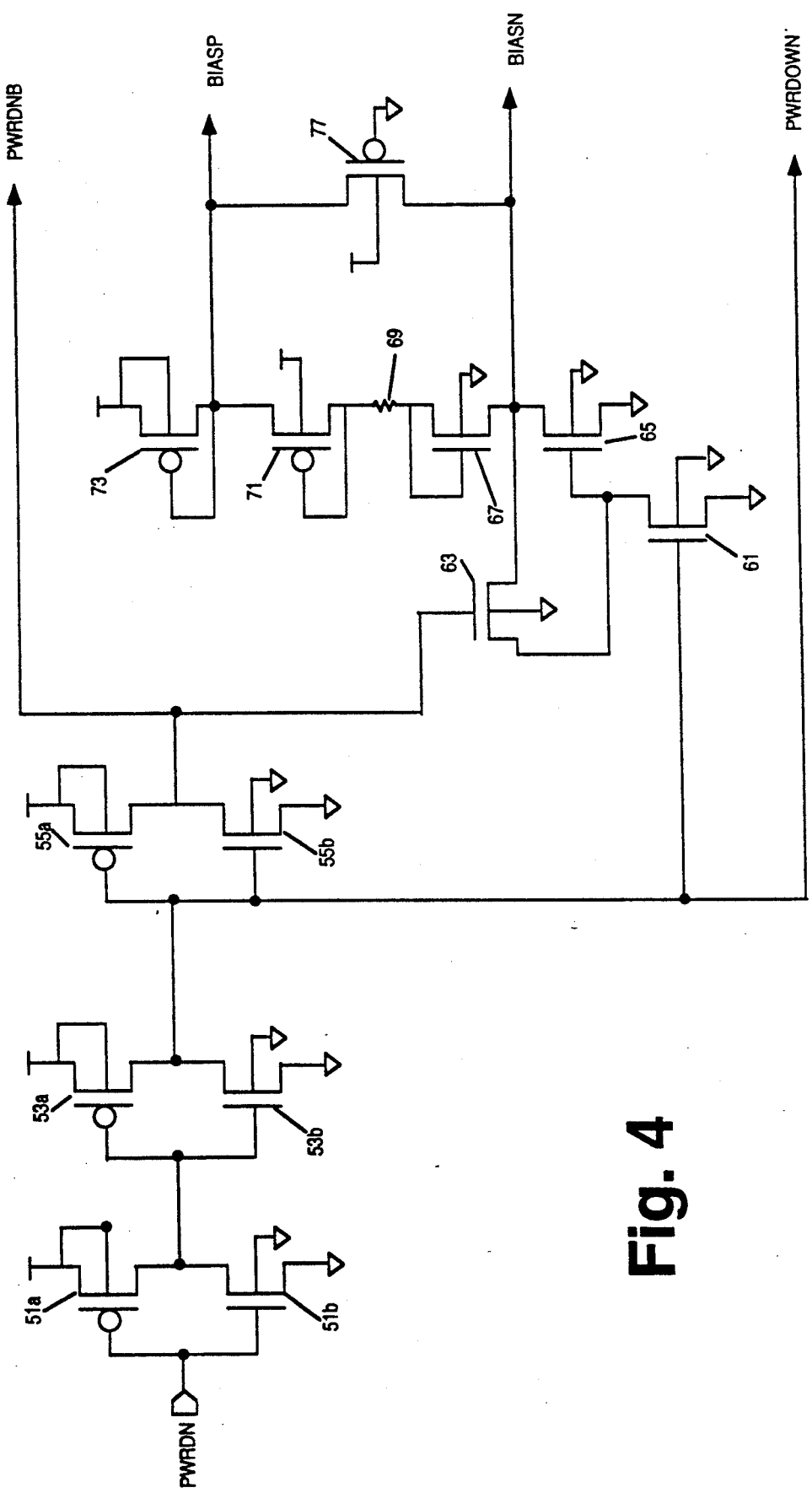
FIG. 4 is a circuit diagram of the biasing element, current mirror voltage divider 21.

Referring next to FIG. 4, an implementation of current mirror voltage divider 21 is shown which provides bias voltages to OTAs 17a and 17b. The bias voltages minimize variations in the output of OTAs 17a and 17b due to power supply variations and process variations which may occur during fabrication. A power down signal PWRDN is generated by microprocessor 22 to save power consumption when the amplifier system is not used during the idle mode. The PWRDN signal is coupled to two inverter buffers 51a/51b and 53a/53b to isolate any digital noise propagating through the bias circuit. The inverter 55a/55b generates an inverse power down signal PWRDNB to turn off the output P transistor 47a. Furthermore, the PWRDNB and PWRDOWN signals shut off the DC path current in the bias network by enabling the N transistor 61 and disabling the transistor 63.

The voltage divider is formed when the power down signal is not enabled. P MOS transistor 73 provides a threshold voltage for OTA transistor 39a. Thus, transistor 39a mirrors the drain current of the transistor 73 based on their ratio. In a similar manner, N MOS transistor 65 provides a mirror current for OTA transistor 39b. The transistors 71, 67 and the resistor 69 are used to control the bias current as required. In this design, the bias is adjusted for an AB class amplifier which can reduce the cross-talk noise. In case of a power drop, the transistor 77 is turned on to sustain a DC current to replace the function of the transistors 71, 67 and the resistor 69.

Figure 5:
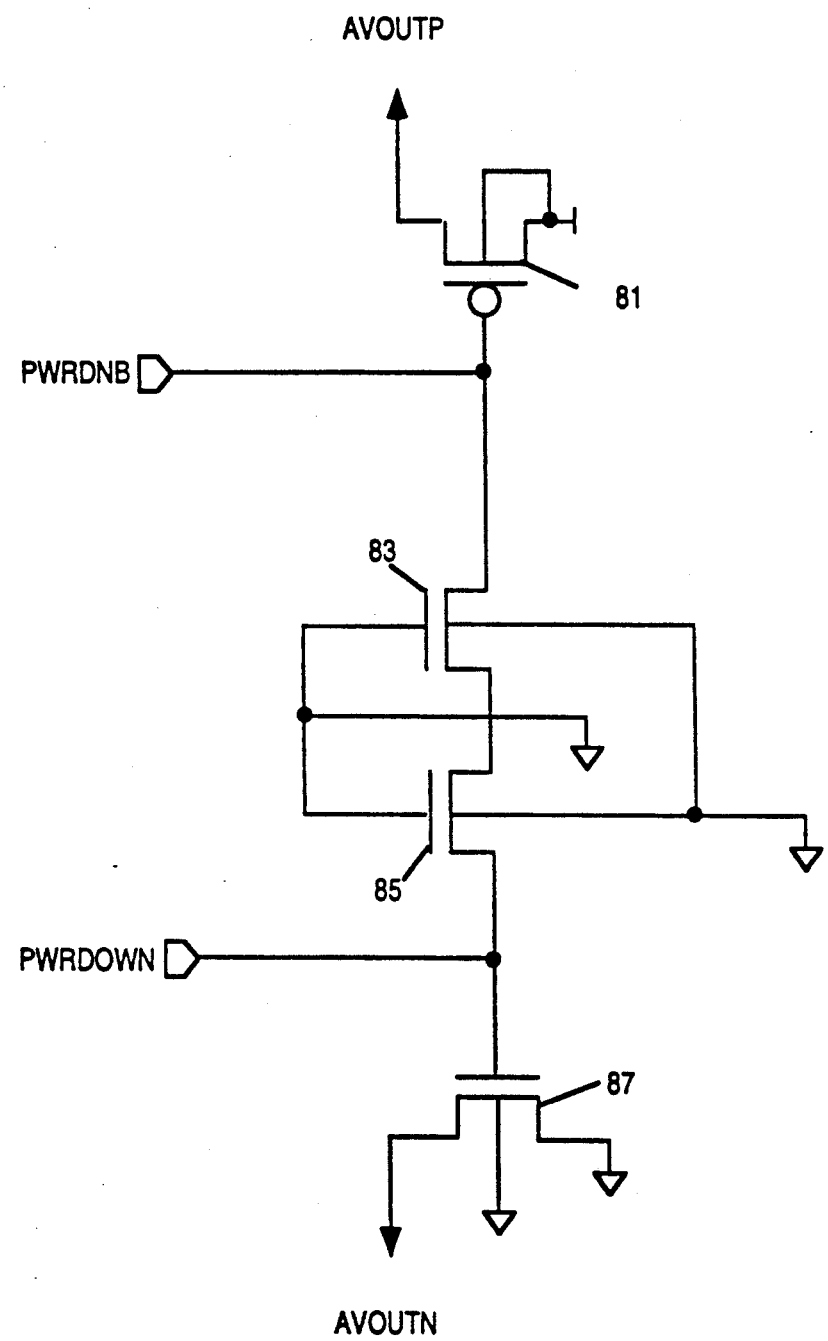
FIG. 5 is a circuit diagram of power down circuit 15.

Referring to FIG. 5, which shows the details of power down circuit 15, the power down signals PWRDNB and PWRDOWN also control two MOS resistors 81 and 87 to eliminate clicking noise when the amplifier is disabled by PWRDN. The transistors 83 and 85 are ESD protection transistors which provide protection to transistors 81 and 87.

We claim:

1. A differential unity gain amplifier adapted to be implemented within an application specific integrated circuit having the capability of driving a capacitive load of up to approximately 200 nanofarads comprising:

a) a first pair of very wide common mode range differential amplifier means for coupling to a first component of an input differential analog signal;

b) a second pair of very wide common mode range differential amplifier means for coupling to a second component of said input differential analog signal;

c) a first operational transconductance amplifier means coupled to respective outputs of said first pair of very wide common mode range differential amplifier means;

d) a second operational transconductance amplifier means coupled to respective outputs of said second pair of very wide common mode range differential amplifier means, said first and second operational transconductance amplifier means for amplifying said respective outputs producing an output current for driving a capacitative load;

e) biasing means for generating positive and negative biasing signals as inputs to said first and second operational transconductance amplifier means, said positive and negative biasing signals adapted to minimize output variations of said first and second operational transconductance amplifier means due to power supply variations and process variations.

2. The amplifier defined by claim 1 further comprising power down circuit means for turning off said first pair and second pair of very wide common mode range differential amplifier means and said first and second operational transconductance amplifier means.

3. The amplifier defined by claim 1 wherein each of first and second operational transconductance amplifier means comprises:

a) a first N channel enhancement mode transistor coupled to one of a predetermined one of said first and second pairs of very wide common mode range differential amplifier means;

b) a first P channel enhancement mode transistor coupled to one of a predetermined one of said first and second pairs of very wide common mode range differential amplifier means;

c) a second P channel enhancement mode transistor coupled to said biasing means;

d) a second N channel enhancement mode transistor coupled to said biasing means;

e) a first depletion MOS capacitor cascading with a first MOS null resistor coupled to said first N channel enhancement mode transistor;

f) a second depletion MOS capacitor cascading with a second MOS null resistor coupled to said first P channel enhancement mode transistor;

g) an output P transistor coupled to said first depletion MOS capacitor;

h) an output N transistor coupled to said second depletion MOS capacitor.

* * * * *